(12) United States Patent
Kurachi

(10) Patent No.: US 11,346,873 B2
(45) Date of Patent: May 31, 2022

(54) CAPACITANCE DETECTION DEVICE

(71) Applicant: AISIN CORPORATION, Aichi (JP)

(72) Inventor: Hideya Kurachi, Kariya (JP)

(73) Assignee: AISIN CORPORATION, Kariya (JP)

( * ) Notice: Subject to any disclaimer, the term of this patent is extended or adjusted under 35 U.S.C. 154(b) by 58 days.

(21) Appl. No.: 16/815,321

(22) Filed: Mar. 11, 2020

(65) Prior Publication Data

US 2020/0292601 A1 Sep. 17, 2020

(30) Foreign Application Priority Data

Mar. 13, 2019 (JP) .............................. JP2019-046086

(51) Int. Cl.
 *G01R 27/26* (2006.01)
(52) U.S. Cl.
 CPC .................................. *G01R 27/2605* (2013.01)
(58) Field of Classification Search
 CPC .................................................. G01R 27/2605
 See application file for complete search history.

(56) References Cited

U.S. PATENT DOCUMENTS

| | | | |
|---|---|---|---|
| 7,015,705 B2 | 3/2006 | Inaba et al. | |
| 7,098,675 B2* | 8/2006 | Inaba | G01D 5/24 324/678 |
| 2010/0244859 A1* | 9/2010 | Cormier, Jr. | G06F 3/0446 324/678 |

FOREIGN PATENT DOCUMENTS

| | | |
|---|---|---|
| JP | 4310695 B2 | 8/2009 |
| JP | 4356003 B2 | 11/2009 |

OTHER PUBLICATIONS

U.S. Appl. No. 16/815,288, filed Mar. 11, 2020, Hideya Kurachi, et al.
U.S. Appl. No. 16/815,321, filed Mar. 11, 2020, Hideya Kurachi.

* cited by examiner

*Primary Examiner* — Noam Reisner
(74) *Attorney, Agent, or Firm* — Oblon, McClelland, Maier & Neustadt, L.L.P.

(57) ABSTRACT

A capacitance detection device includes: a capacitor array having parallel-connected capacitors having different capacitances, and whose combined capacitance is changed by selectively switching the capacitors; a detection capacitor connected in series to the capacitor array; a switching control unit selectively switching the capacitors; a detection unit detecting an intermediate potential that is a potential of a capacitive voltage division of a power supply; an acquisition unit acquiring, as a reference combined capacitance, any of the combined capacitances in a vicinity where a magnitude relationship between the intermediate potential and a predetermined reference potential is inverted; a determination unit determining whether or not a detection target is present; a capacitance change unit controlling the switching control unit to change the reference combined capacitance; and a setting unit setting the determination threshold based on a difference between the intermediate potentials in the reference combined capacitance and in the changed reference combined capacitance.

5 Claims, 4 Drawing Sheets

COMBINED CAPACITANCE CS OF CAPACITOR ARRAY

EQUIVALENT CAPACITANCE   C7  C6  C5  C4  C3  C2  C1  C0  $\frac{C0}{2}$  $\frac{C0}{2^2}$  $\frac{C0}{2^3}$  $\frac{C0}{2^4}$  $\frac{C0}{2^5}$  $\frac{C0}{2^6}$  $\frac{C0}{2^7}$

NO SIGN   | B7 | B6 | B5 | B4 | B3 | B2 | B1 | B0 |

2'S COMPLEMENT (WITH SIGN)   | B9 | B8 | B7 | B6 | B5 | B4 | B3 | B2 | B1 | B0 |

CAPACITANCE DETECTION DEVICE

CROSS REFERENCE TO RELATED APPLICATIONS

This application is based on and claims priority under 35 U.S.C. § 119 to Japanese Patent Application 2019-046086, filed on Mar. 13, 2019, the entire contents of which are incorporated herein by reference.

TECHNICAL FIELD

This disclosure relates to a capacitance detection device.

BACKGROUND DISCUSSION

In the related art, for example, a device disclosed in Japanese Patent No. 4356003 (Reference 1) has been known as a capacitance detection device. The capacitance detection device includes: a reference capacitor; a detection capacitor (capacitor to be measured) connected to the reference capacitor, the capacitance of which varies based on whether or not a detection target is present; a first switch that initializes the reference capacitor; a second switch disposed between the reference capacitor and the detection capacitor; a third switch that initializes the detection capacitor; and a control circuit. After initializing the reference capacitor by operating the first switch, the control circuit performs a switch operation including the operation of the second switch and the operation of the third switch a plurality of times, acquires an intermediate potential that is a potential between the reference capacitor and the detection capacitor, and derives the number of times of the switch operation when the intermediate potential is lower than a reference potential. This number of times of the operation count is hereinafter referred to as a count value. This count value is correlated with the capacitance of the detection capacitor, and the capacitance of the detection capacitor is detected by deriving the count value.

Further, a capacitance change of the detection capacitor is detected based on a difference between the initially derived count value and the subsequently derived count value. Therefore, whether or not a detection target is present can be determined based on a magnitude relationship between the difference between the count values and a predetermined determination threshold.

Here, the capacitance of the detection capacitor changes under an influence of a parasitic capacitance included in a measurement system, for example, even in an initial state in which no detection target is present. On the other hand, the capacitance of the detection capacitor is a well-known exponential function of the number of times of inspections. That is, the capacitance of the detection capacitor is not proportional to the number of times of inspections. Therefore, even when the capacitance change of the detection capacitor is the same, if the absolute value of the detection capacitor including the parasitic capacitance is small, the difference between the count values becomes relatively large, and conversely, when the absolute value of the detection capacitor including the parasitic capacitance is large, the difference between the count values becomes relatively small. That is, the difference between the count values, that is, a sensitivity for determining whether or not the detection target is present, varies according to the parasitic capacitance included in the capacitance of the detection capacitor.

Therefore, in a capacitance detection device disclosed in Japanese Patent No. 4310695 (Reference 2), a configuration is adopted in which a sensitivity compensation capacitor having a capacitance corresponding to a capacitance change of the detection capacitor caused by whether or not the detection target is present is selectively connected in parallel with the detection capacitor. Thus, it is proposed to set, as a determination threshold, a difference between the number of times of inspections derived in a state of only the detection capacitor and the number of times of inspections derived in a state in which the detection capacitor and the sensitivity compensation capacitor are connected in parallel to each other. In this case, the determination threshold is set in accordance with the change in the capacitance of the detection capacitor caused by whether or not the detection target is present, so that determination threshold for whether or not the detection target is present follows the absolute value of the detection capacitor including the parasitic capacitance.

By the way, in References 1 and 2, the capacitance of the detection capacitor and a change in the capacitance are detected by deriving the count value. Therefore, since the capacitance of one count becomes a detection resolution, it is necessary to increase the number of times of a switch operation in order to improve determination accuracy of whether or not the detection target is present. For example, the number of times of switch operations may be on the order of tens of thousands. Accordingly, a time required for determining whether or not the detection target is present increases.

On the other hand, if the time required for determining whether or not the detection target is present increases, influence of low-frequency noise superimposed on a power supply (first and second potential sources) related to the determination and an increase in the fluctuation width of the power supply itself becomes remarkable, and conversely, the determination accuracy may be reduced. That is, increasing the number of times of the switch operation in order to improve the determination accuracy may conversely cause a reduction in the determination accuracy.

Thus, a need exists for a capacitance detection device which is not susceptible to the drawback mentioned above.

SUMMARY

A capacitance detection device according to an aspect of this disclosure includes: a capacitor array which has a plurality of parallel-connected capacitors having different capacitances, and whose combined capacitance is changed by selectively switching the plurality of capacitors between on and off states; a detection capacitor that is connected in series to the capacitor array; a switching control unit that selectively switches the plurality of capacitors between the on and off states; a detection unit that detects an intermediate potential that is a potential of a capacitive voltage division of a power supply by the combined capacitance and a capacitance of the detection capacitor; an acquisition unit that acquires, as a reference combined capacitance, any of the combined capacitances in a vicinity where a magnitude relationship between the intermediate potential and a predetermined reference potential is inverted; a determination unit that determines whether or not a detection target is present, based on a magnitude relationship between a determination threshold and a change amount of the intermediate potential when the combined capacitance is the reference combined capacitance; a capacitance change unit that controls the switching control unit to change the reference combined capacitance by a predetermined capacitance change amount such that the change amount of the intermediate potential based on a capacitance change of the detection capacitor caused by presence of the detection target is generated; and a setting unit that sets the determination threshold based on a difference between the intermediate potential in the reference combined capacitance and the intermediate potential in the changed reference combined capacitance.

BRIEF DESCRIPTION OF THE DRAWINGS

The foregoing and additional features and characteristics of this disclosure will become more apparent from the following detailed description considered with the reference to the accompanying drawings, wherein.

DETAILED DESCRIPTION

Hereinafter, an embodiment of a capacitance detection device will be described.

Figure 1:
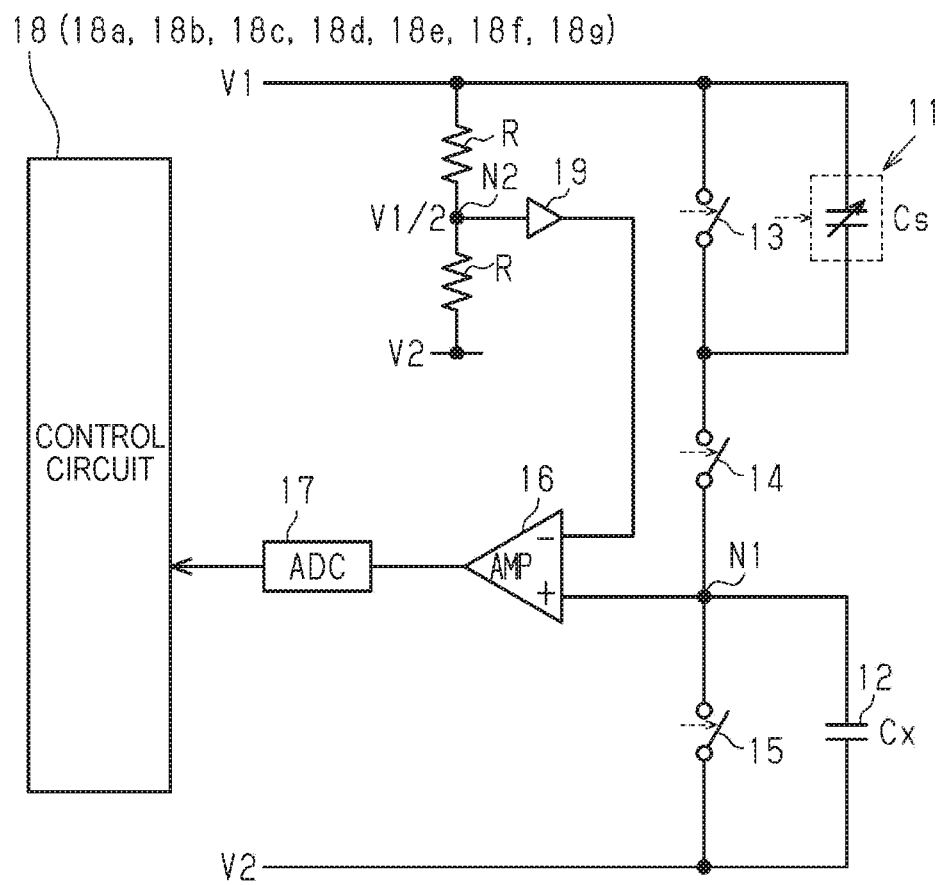
FIG. 1 is a circuit diagram showing an electrical configuration of an embodiment of a capacitance detection device.

As shown in FIG. 1, the capacitance detection device includes a capacitor array 11, a detection capacitor 12, a first switch 13, a second switch 14, a third switch 15, and a differential amplifier circuit 16 as an amplification unit, an AD conversion circuit 17 as an AD conversion unit, and a control circuit 18.

Figure 2:
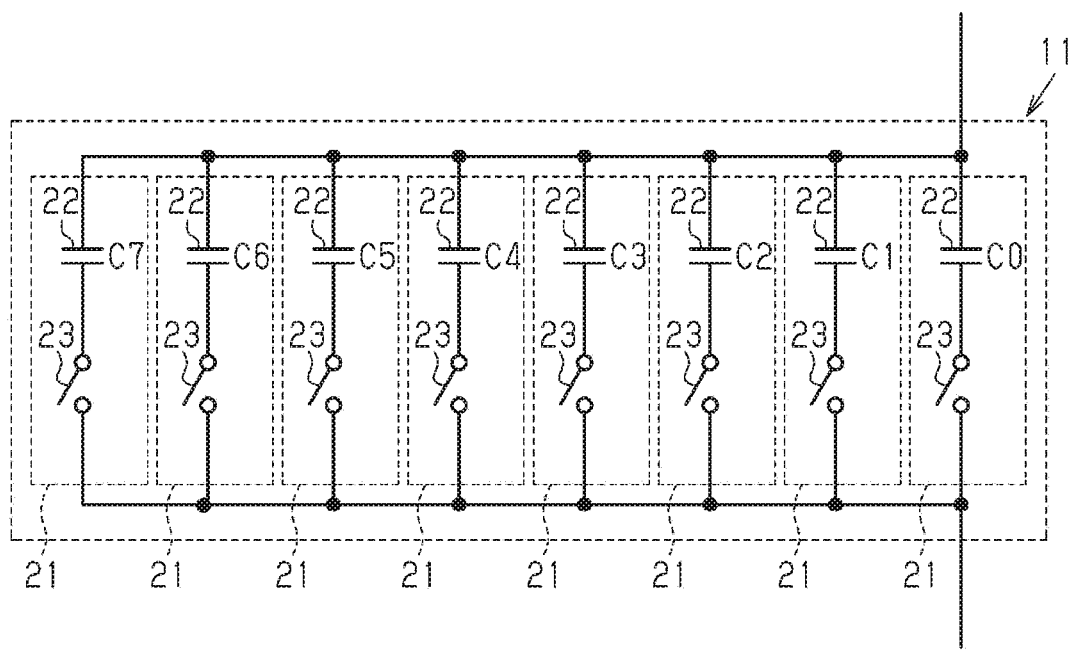
FIG. 2 is a circuit diagram showing a capacitor array of the capacitance detection device according to the embodiment.

The capacitor array 11 has a variable combined capacitance Cs. That is, as shown in FIG. 2, the capacitor array 11 is configured as a plurality of (for example, eight) capacitance units 21, each having a capacitor 22 and a switch 23 connected in series to each other, are connected in parallel to each other. The capacitances of a plurality of the capacitors 22 are set to be different from each other. In detail, when the capacitance of the capacitor 22 having the minimum capacitance is represented by C0, the capacitances C0, C1, C2, C3, C4, C5, C6, and C7 of all the capacitors 22 are set to satisfy Equation (1).

$$Cn = C0 \times 2^n, \quad n=0 \text{ to } 7 \quad (1)$$

Further, the switch 23 connected to the capacitor 22 having the capacitance Cn is switched between an on state and an off state according to a control value bn (n=0-7) of the capacitor array 11 set by the control circuit 18. That is, the switch 23 is turned on when the control value bn is "1", and is turned off when the control value bn is "0".

Therefore, the combined capacitance Cs of the capacitor array 11 is represented by Equation (2) according to the control value bn (n=0 to 7).

$$Cs = b0 \cdot C0 + b1 \cdot C1 + \ldots + b7 \cdot C7 \quad (2)$$

That is, the combined capacitance Cs changes according to the control value bn ("1" or "0") with the capacitance C0 as the minimum unit (LSB).

The capacitor array 11 is arranged so that the capacitances C0 to C7 of the respective capacitors 22 do not fluctuate, for example, even when the surrounding environment changes.

As shown in FIG. 1, when the detection target (not shown) does not exist, the detection capacitor 12 has a substantially stable capacitance (hereinafter, referred to as a "detection capacitance Cx") including a capacitance thereof and a parasitic capacitance determined by the surrounding environment. However, the detection capacitance Cx varies together with the parasitic capacitance included therein due to a change in the surrounding environment. Further, the detection capacitance Cx varies due to the existence of the detection target. The "existence of the detection target" means, for example, proximity or contact of the detection target with respect to the detection capacitor 12.

The capacitor array 11 and the detection capacitor 12 are connected in series to a power supply V1. That is, one end of the capacitor array 11 is electrically connected to the high side potential V1 as a power supply, and the other end thereof is electrically connected to one end of the detection capacitor 12 via the second switch 14. The other end of the detection capacitor 12 is electrically connected to a low-side potential V2 (<V1) as a power supply. The low-side potential V2 is set to, for example, the same potential (=0) as the ground.

The first switch 13 initializes the capacitor array 11 (discharges charges stored in the capacitors). In detail, the first switch 13 is connected between, that is, is connected in parallel to, both terminals of the capacitor array 11 (the plurality of capacitance units 21), and connects and disconnects both terminals of the capacitor array 11 according to switching to the on state and the off state. More strictly, for example, when all the switches 23 of the plurality of capacitance units 21 are in the on state, the first switch 13 connects/initializes both terminals of all the capacitors 22 of the plurality of capacitance units 21 according to the switching to the on state (discharges the charges stored in the capacitors). The second switch 14 is electrically connected between the capacitor array 11 and the detection capacitor 12, and connects and disconnects between the capacitor array 11 and the detection capacitor 12 according to switching to the on state and the off state. The third switch 15 initializes the detection capacitor 12 (discharges the charges stored in the capacitors). In detail, the third switch 15 is connected between, that is, is connected in parallel to, both terminals of the detection capacitor 12, and connects and disconnects both terminals of the detection capacitor 12 according to the switching to the on state and the off state.

The differential amplifier circuit 16 has a positive electrode input terminal+connected to a connection point N1 of the capacitor array 11 and the detection capacitor 12. The differential amplifier circuit 16 has a negative electrode input terminal—connected, via an amplifier circuit 19, to a connection point N2 of a pair of resistors R connected in series to a power supply. The differential amplifier circuit 16 receives an intermediate potential Vout, which is a potential at the connection point N1, and a reference potential Vref (=V1/2) obtained by dividing the power supply by the pair of resistors R, and amplifies and outputs a differential voltage ΔV (=Vout−Vref).

The intermediate potential Vout is a potential of capacitive voltage division of the power supply by the combined capacitance Cs of the capacitor array 11 and the detection capacitance Cx of the detection capacitor 12, and is expressed by Equation (3).

$$Vout = V1/(1+Cx/Cs) \quad (3)$$

That is, the intermediate potential Vout is inversely proportional to a ratio of the detection capacitance Cx to the combined capacitance Cs (=Cx/Cs).

The differential voltage ΔV is expressed by Equation (4).

$$\Delta V = Vout - Vref = V1/(1+Cx/Cs) - V1/2 \quad (4)$$

Therefore, when the combined capacitance Cs coincides with the detection capacitance Cx (Cx/Cs=1), the intermediate potential Vout coincides with the reference potential Vref, and the differential voltage ΔV thus becomes zero.

The polarity of the differential voltage ΔV becomes negative when the detection capacitance Cx is larger than the combined capacitance Cs, and becomes positive when the detection capacitance Cx is smaller than the combined capacitance Cs. Therefore, the differential amplifier circuit 16 functions as a comparator that determines a magnitude relationship between the combined capacitance Cs and the detection capacitance Cx when changing the combined capacitance Cs of the capacitor array 11 according to the control value bn (n=0-7).

The AD conversion circuit 17 has, for example, a 10-bit code, performs AD conversion on the differential voltage ΔV amplified by the differential amplifier circuit 16, and outputs the converted result to the control circuit 18. As is apparent from Equation (4), when a deviation between the combined capacitance Cs and the detection capacitance Cx is small (Cx/Cs≈1), the differential voltage ΔV is close to zero, but when the deviation between the combined capacitance Cs and the detection capacitance Cx is large, the differential voltage ΔV is a positive or negative number having a large absolute value.

Thus, it is preferable that when the minimum unit (LSB) of the AD conversion of the AD conversion circuit 17 is constant, the differential amplifier circuit 16 is configured to be able to change an amplification factor in accordance with the absolute value of the differential voltage ΔV. In this case, when the absolute value of the differential voltage ΔV exceeds a predetermined value, such as when the combined capacitance Cs of the capacitor array 11 is changed according to the control value bn (n=0-7), the differential amplifier circuit 16 amplifies the differential voltage ΔV at a relatively small amplification factor. On the other hand, when the absolute value of the differential voltage ΔV is lower than the predetermined value, the differential amplifier circuit 16 amplifies the differential voltage ΔV at a relatively large amplification factor. As a result, the AD conversion circuit 17 can perform the AD conversion in the minimum unit substantially changed according to the absolute value of the differential voltage ΔV.

The control circuit 18 is mainly configured with, for example, an MCU (microcomputer), and controls driving of the first switch 13, the second switch 14, and the third switch 15 to generate the intermediate potential Vout which is a potential of a capacitive voltage division of the power supply by the combined capacitance Cs and the detection capacitance Cx. In detail, the control circuit 18 performs the following process A.

1. The first switch 13 and the third switch 15 are both turned on, the second switch 14 is turned off, and the charges are discharged by short-circuiting between the terminals of the capacitor array 11 and the detection capacitor 12. That is, each of the capacitor array 11 and the detection capacitor 12 is initialized.

2. The first switch 13 and the third switch 15 are both turned off, the second switch 14 is turned on, and the capacitor array 11 and the detection capacitor 12 are connected in series to each other. Then, the intermediate potential Vout is generated at the connection point N1.

3. The differential voltage ΔV (=Vout−V1/2) amplified by the differential amplifier circuit 16 and AD-converted by the AD conversion circuit 17 is input to detect the differential voltage ΔV.

That is, the control circuit 18 as a detection unit 18a detects the differential voltage ΔV correlated with the intermediate potential Vout.

Further, the control circuit 18 as a switching control unit 18b sets the control value bn (n=0 to 7), and controls driving of the plurality of switches 23 to selectively switch the plurality of capacitors 22 of the capacitor array 11 between the on state and the off state according to the control values bn (n=0-7). At this time, as described above, the combined capacitance Cs of the capacitor array 11 changes according to the control values bn (n=0 to 7). Then, when changing the combined capacitance Cs of the capacitor array 11 according to the control values bn (n=0 to 7), the control circuit 18 stores, in a built-in memory thereof, the control value bn determined based on the polarity of the differential voltage ΔV AD-converted by the AD conversion circuit 17.

That is, the control circuit 18 uses a so-called binary search technique to obtain the combined capacitance Cs that is close to the detection capacitance Cx of the detection capacitor 12. In detail, the control circuit 18 performs the following process B.

1. The control value b7, which is the uppermost bit of the control value bn of the capacitor array 11, is set to "1", and the control values b6 to b0, which are the other lower bits, are set to "0". That is, the set value is set to "1000_0000".

2. The differential voltage ΔV (=Vout−V1/2) is input or the like according to the process A described above.

3. The control value b7 is determined to be "1" or "0" according to the polarity of the differential voltage ΔV. Then, a determined value a of the control value b7 is stored in the built-in memory. That is, when the polarity of the differential voltage ΔV is negative, the determined value a of the control value b7 is set to "1" since the combined capacitance Cs (=C7) is smaller than the detection capacitance Cx. On the other hand, when the polarity of the differential voltage ΔV is positive, the determined value a of the control value b7 is set to "0" since the combined capacitance Cs (=C7) is larger than the detection capacitance Cx.

4. Similarly, the control value b6 as the next bit is set to "1", and the control values b5 to b0 as the other lower bits are set to "0". That is, the set value is set to "a1000000".

5. The differential voltage ΔV (=Vout−V1/2) is input and the like according to the process A described above.

6. The control value b6 is determined to be "1" or "0" according to the polarity of the differential voltage ΔV. Then, a determined value b of the control value b6 is stored in the built-in memory.

7. The processes of 4 to 6 are similarly repeated to determine the control values b5 to b0, which are the next bits, as "1" or "0", and determined values c to h are stored in the built-in memory.

As described above, the control circuit 18 as an acquisition unit 18c acquires the combined capacitance Cs (hereinafter, also referred to as a "first reference combined capacitance Csb1") represented by the set value "abcd_efgh".

$$Csb1 = a \cdot C7 + b \cdot C6 + \ldots + h \cdot C0 \quad (5)$$

That is, by setting the control values bn (n=0 to 7) according to the set value "abcd_efgh", the combined capacitance Cs coincides with the first reference combined capacitance Csb1.

Figures 3, 4A, 4B, 4C:
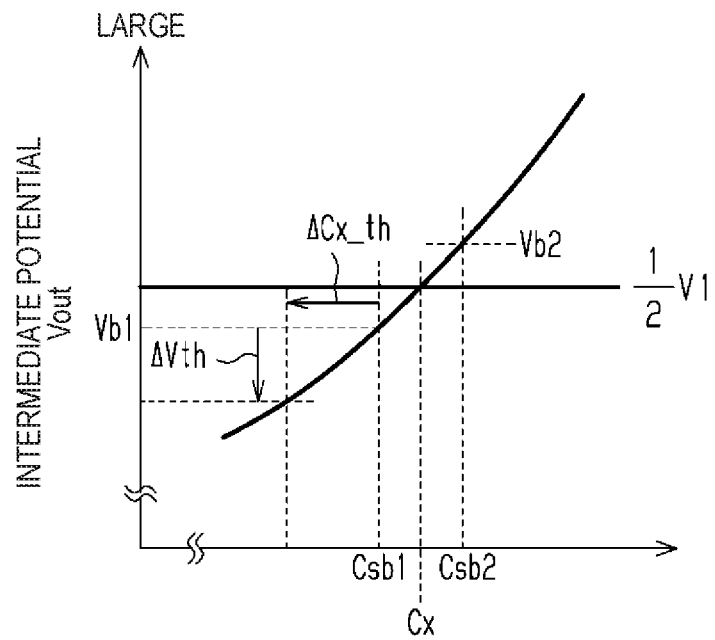
FIG. 3 is a graph illustrating a setting mode of a determination threshold for the capacitance detection device according to the embodiment.
FIGS. 4A to 4C are explanatory diagrams showing bit weights.

As shown in FIG. 3, it is assumed that the first reference combined capacitance Csb1 as the reference combined capacitance Csb is a combined capacitance Cs smaller than the detection capacitance Cx, which is closest to the detection capacitance Cx. The intermediate potential Vout when the combined capacitance Cs is the first reference combined capacitance Csb1 is an intermediate potential Vout smaller than the reference potential Vref, which is closest to the reference potential Vref.

The combined capacitance Cs (hereinafter, also referred to as a "second reference combined capacitance Csb2") obtained by adding the minimum capacitance C0 to the first reference combined capacitance Csb1 is a combined capacitance Cs larger than the detection capacitance Cx, which is closest to the detection capacitance Cx. Then, the intermediate potential Vout when the combined capacitance Cs is the second reference combined capacitance Csb2 is an intermediate potential Vout larger than the reference potential Vref, which is closest to the reference potential Vref.

That is, the adjacent first reference combined capacitance Csb1 and second reference combined capacitance Csb2 in which a magnitude relationship between the intermediate potential Vout and the reference potential Vref is inverted are the combined capacitances Cs expressed in a resolution range of the capacitor array 11, which is closest to the detection capacitance Cx.

Here, when the combined capacitance Cs is the first reference combined capacitance Csb1, if the detection capacitance Cx changes according to the existence of the detection target, the intermediate potential Vout changes accordingly. The control circuit 18 serving as a determination unit 18d determines whether or not the detection target is present, based on a magnitude relationship between a determination threshold ΔVth and a voltage change amount DV of the intermediate potential Vout with respect to the reference potential Vref (=V1/2) that is close to the intermediate potential Vout when the combined capacitance Cs is the first reference combined capacitance Csb1. That is, the control circuit 18 determines that the detection target is present when the voltage change amount DV is larger than the determination threshold ΔVth. Conversely, the control circuit 18 determines that the detection target does not exist when the voltage change amount DV is equal to or smaller than the determination threshold ΔVth.

By the way, it is preferable that the determination threshold ΔVth related to the determination on whether or not the detection target is present coincides with the voltage change amount DV (hereinafter, referred to as a "determination voltage change amount DVj") when a predetermined capacitance change ΔC of the detection capacitance Cx assumed when the detection target is present is generated. This is because, as expressed by Equation (3), the intermediate potential Vout is inversely proportional to a ratio (Cx/Cs) of the detection capacitance Cx to the combined capacitance Cs, and even when the capacitance change ΔC of the detection capacitance Cx is the same, the voltage change amount DV of the intermediate potential Vout differs according to the detection capacitance Cx. That is, even when the capacitance change ΔC of the detection capacitor Cx is the same, the voltage change amount DV of the intermediate potential Vout becomes relatively large when the parasitic capacitance is small, and conversely, the voltage change amount DV of the intermediate potential Vout becomes relatively small when the parasitic capacitance is large.

Further, as is apparent from Equation (3), when the combined capacitance Cs coincides with the first reference combined capacitance Csb1, a determination voltage change amount DVj accompanying the capacitance change ΔC of the detection capacitance Cx can be equal to the voltage change amount DV when the first reference combined capacitance Csb1 is changed by a predetermined capacitance change amount ΔCx_th.

$$DVj = V1/(1+(Cx+\Delta C)/Csb1) - V1/2\} = V1/(1+Cx/(Csb1-\Delta Cx\_th)) - V1/2\Delta Cx\_th = \Delta C \cdot Csb1/(Cx+\Delta C) \quad (6)$$

That is, when the combined capacitance Cs is decreased from the first reference combined capacitance Csb1 by the capacitance change amount ΔCx_th represented by Equation (6), the determination voltage change amount DVj is generated at the intermediate potential Vout. The control circuit 18 as a capacitance change unit 18e controls the switching control unit 18b to change the first reference combined capacitance Csb1 by a predetermined capacitance change amount ΔCx_th such that the determination voltage change amount DVj based on the capacitance change ΔC of the detection capacitance Cx caused by the existence of the detection target is generated.

In detail, it is assumed that the capacitance change amount ΔCx_th is represented by a set value "0000_0010". In this case, the control circuit 18 calculates a set value (="abcd_efgh"−"0000_0010") obtained by subtracting the set value "0000_0010" from the set value "abcd_efgh". When the control value bn (n=0 to 7) is set according to the calculated set value, the combined capacitance Cs coincides with a capacitance (=Csb1−ΔCx_th) obtained by subtracting the capacitance change amount ΔCx_th from the first reference combined capacitance Csb1.

The control circuit 18 as a setting unit 18f sets, as the determination threshold ΔVth, a difference between the intermediate potential Vout when the combined capacitance Cs is the first reference combined capacitance Csb1 and the intermediate potential Vout in the first reference combined capacitance Csb1 obtained by subtracting the capacitance change amount ΔCx_th.

Here, since the determination threshold ΔVth is the difference between the intermediate potentials Vout, even when the amplification factor in the differential amplifier circuit 16 is changed in a predetermined manner, the relationships for determining whether or not the detection target is present are equivalent. Further, when the capacitance change amount ΔCx_th is relatively small, when the combined capacitance Cs changes from the first reference combined capacitance Csb1 by the capacitance change amount ΔCx_th, it can be approximated that the intermediate potential Vout changes in proportion thereto. Further, as approximated by Equation (6), when the capacitance change ΔC of the detection capacitance Cx is relatively small, it can be considered that the capacitance change ΔC is proportional to the capacitance change amount ΔCx_th. Thus, in the present embodiment, the amplification factor of the differential amplifier circuit 16 is set such that the change amount of the detection capacitance Cx and the voltage change amount of the intermediate potential Vout when the detection capacitance Cx is equal to the first reference combined capacitance Csb1 have the same value. Accordingly, a digital value of the differential voltage ΔV that has been AD-converted by the AD conversion circuit 17 can be used as the change amount of the detection capacitance Cx as it is.

That is, as shown in FIGS. 4A to 4C, the capacitances Cn (n=0-7) correspond to the equivalent capacitances of bits Bn (n=0-7) of the control value bn determined by the above-described binary search technique, in this order. On the other hand, as described above, when the intermediate potential Vout is close to the reference potential Vref, the digital value of the differential voltage ΔV is expressed by a minimum unit smaller than the voltage change of the intermediate potential Vout due to a change corresponding to the resolution of the combined capacitance Cs. Thus, at this time, the digital value of the differential voltage ΔV basically corresponds to a capacitance smaller than the capacitance Cn.

In detail, at this time, the amplification factor of the differential amplifier circuit 16 is determined such that the input range of the AD conversion circuit 17 is equivalent to the capacitance C3 and is at least twice the determination threshold ΔVth. Thus, a capacitance Cdn (n=0 to 8) represented by Equation (7) corresponds to the equivalent capacitance of the bit Bn (n=0 to 8) of the digital value of the differential voltage ΔV in this order. The uppermost bit B9 indicates a sign of the digital value of the differential voltage ΔV.

$$Cdn = C0 \times 2^{(n-7)}, n=0 \text{ to } 8 \quad (7)$$

That is, although the capacitance Cdn basically corresponds to a capacitance smaller than the capacitance Cn, the higher-order capacitances Cd7 and Cd8 overlap the capacitance Cn.

As described above, since the digital value of the differential voltage ΔV can be used as the change amount of the detection capacitance Cx as it is, the detection capacitance Cx is obtained by adding the 8-bit control value bn representing the combined capacitance Cs to the digital value of the weighted differential voltage ΔV, that is, by adding a value obtained by shifting the control value bn of the combined capacitance Cs in a left direction by 7 bits to the digital value of the differential voltage ΔV.

As described above, in the AD conversion circuit 17, the minimum resolution is C3/2^10, and the maximum input range is about twice the capacitance C7. In particular, if the first reference combined capacitance Csb1 of the capacitor array 11 is determined, for example, the detection and setting of the determination threshold ΔVth corresponding to the capacitance C2 can be performed while maintaining the amplification factor of the differential amplifier circuit 16 determined as described above.

The control circuit 18 executes this calculation when setting the determination threshold ΔVth. When determining whether or not the detection target is present, the control circuit 18 controls the switching control unit 18b to set the combined capacitance Cs to the first reference combined capacitance Csb1. Then, the control circuit 18 inputs the digital value of the differential voltage ΔV while maintaining the amplification factor of the differential amplifier circuit 16 determined as described above. Then, as described above, the control circuit 18 determines whether or not the detection target is present, based on a magnitude relationship between the digital value of the differential voltage ΔV corresponding to the voltage change amount DV and the determination threshold ΔVth.

Figure 5:
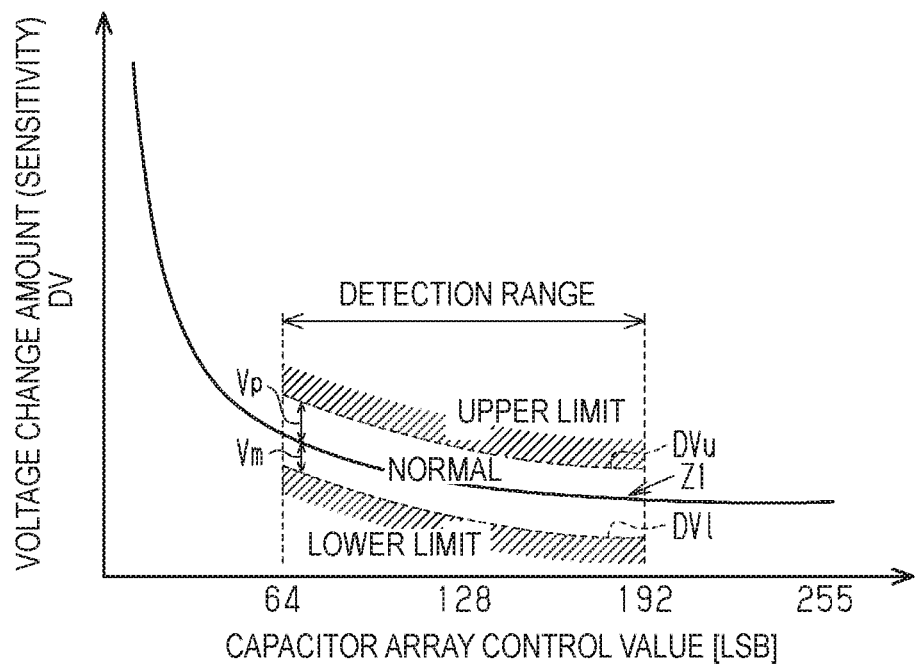
FIG. 5 is a graph illustrating a determination mode on whether or not the device is normal by a self-diagnosis unit in the capacitance detection device according to the embodiment.

Further, the control circuit 18 as a self-diagnosis unit 18g determines whether or not the device is normal, based on whether or not the determination threshold ΔVth set by the setting unit 18f falls within a predetermined normality determination numerical value range. That is, as shown in FIG. 5, by changing the combined capacitance Cs of the capacitor array 11, which is determined to be equal to the detection capacitance Cx of the detection capacitor 12 including the parasitic capacitance, that is, the control value bn, the voltage change amount DV that is the determination threshold ΔVth for whether or not the detection target is present can be set by the setting unit 18f, but this action operates the entire circuit. Therefore, if any one has failed, the wrong voltage change amount DV is set as the determination threshold ΔVth. That is, the voltage change amount DV becomes an abnormal value. Therefore, since a relationship between the sensitivity and the combined capacitance Cs including the parasitic capacitance, which is equivalent to the detection capacitance Cx of the detection capacitor 12 including the parasitic capacitance, can be grasped in advance, a monitoring standard value is set and monitored with a margin for the voltage change amount DV that is the determination threshold ΔVth, so that abnormality of the capacitance detection device can be detected.

In FIG. 5, in a graph showing a relationship between the combined capacitance Cs and the voltage change DV grasped in advance, an example is shown in which a normality determination numerical value range Z1 sandwiched between an upper limit threshold DVu (=DV+Vp) obtained by adding a predetermined addition value Vp to the voltage change DV within a detection range and a lower limit threshold DV1 (=DV−Vm) obtained by subtracting a predetermined subtraction value Vm from the voltage change amount DV within the detection range is set as the monitoring standard value. Therefore, when changing the combined capacitance Cs of the capacitor array 11, which is determined to be equal to the detection capacitance Cx of the detection capacitor 12 including the parasitic capacitance, that is, the control value bn, if the voltage change amount DV falls within the normality determination numerical value range Z1, the control circuit 18 performs normality determination. Conversely, if the voltage change amount DV deviates from the normality determination numerical value range Z1, the control circuit 18 performs abnormality determination.

Figure 6:
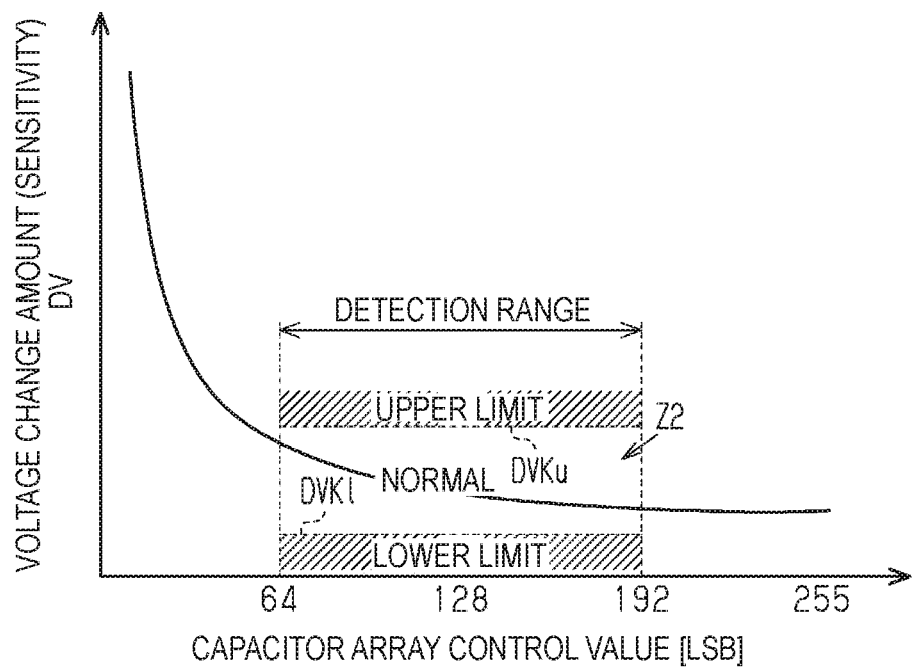
FIG. 6 is a graph illustrating a determination mode on whether or not the device is normal by a self-diagnosis unit in the capacitance detection device according to the embodiment.

Alternatively, in FIG. 6, in a graph showing a relationship between the combined capacitance Cs and the voltage change amount DV grasped in advance, an example is shown in which a normality determination numerical value range Z2 sandwiched between a predetermined upper limit threshold DVKu larger than the voltage change amount DV within the detection range and a predetermined lower limit threshold DVKl smaller than the voltage change amount DV within the detection range is set as the monitoring standard value. Therefore, when changing the combined capacitance Cs of the capacitor array 11, which is determined to be equal to the detection capacitance Cx of the detection capacitor 12 including the parasitic capacitance, that is, the control value bn, if the voltage change amount DV falls within the normality determination numerical value range Z2, the control circuit 18 performs normality determination. Conversely, if the voltage change amount DV deviates from the normality determination numerical value range Z2, the control circuit 18 performs abnormality determination.

Next, setting of the determination threshold ΔVth by the control circuit 18 will be described in general. This processing may be executed, for example, when the control circuit 18 starts, or may be executed by a periodic interruption.

Figure 7:
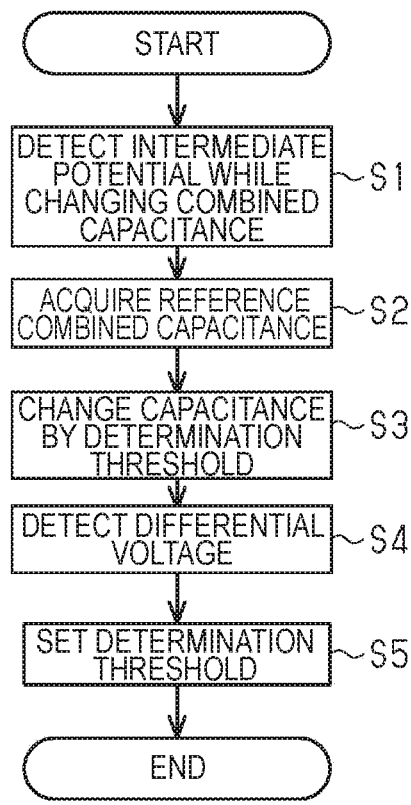
FIG. 7 is a flowchart showing a setting mode of a determination threshold in the capacitance detection device according to the embodiment.

As shown in FIG. 7, when the processing shifts to this routine, in step S1, the control circuit 18 changes the combined capacitance Cs of the capacitor array 11 by the processing A and B described above while detecting the intermediate potential Vout accordingly changed, more specifically, the differential voltage ΔV.

Subsequently, in step S2, the control circuit 18 obtains, as the reference combined capacitance Csb, the first reference combined capacitance Csb1 that is one of the two adjacent combined capacitances Cs in which the magnitude relationship between the intermediate potential Vout and the reference potential Vref is inverted.

Next, in step S3, the control circuit 18 changes the first reference combined capacitance Csb1 by the capacitance change amount ΔCx_th such that the voltage change amount DV of the intermediate potential Vout based on the capacitance change ΔC of the detection capacitance Cx caused by the existence of the detection target is generated.

In step S4, the control circuit 18 detects the differential voltage ΔV when the combined capacitance Cs is changed from the first reference combined capacitance Csb1.

Next, in step S5, the control circuit 18 sets the determination threshold ΔVth based on the differential voltage ΔV at this time.

The operation and effect of the present embodiment will be described.

(1) In the present embodiment, the acquisition unit 18*c* acquires the reference combined capacitance Csb closest to the capacitance of the capacitor array 11 when the intermediate potential Vout coincides with the reference potential Vref. Then, the determination unit 18*d* determines whether or not the detection target is present, based on the magnitude relationship between the voltage change amount DV of the intermediate potential Vout when the combined capacitance Cs is the reference combined capacitance Csb and the determination threshold ΔVth.

The capacitance change of the detection capacitor 12 caused by the existence of the detection target is independent of the parasitic capacitance included in the capacitance of the detection capacitor 12. On the other hand, when the combined capacitance Cs is the reference combined capacitance Csb, the voltage change amount DV of the intermediate potential Vout due to the capacitance change of the detection capacitor 12, that is, the determination threshold ΔVth for whether or not the detection target is present, changes according to the absolute value of the detection capacitance Cx including the parasitic capacitance of the detection capacitor 12. Therefore, when the combined capacitance Cs is the reference combined capacitance Csb, if the voltage change amount DV of the intermediate potential Vout when the capacitance change of the detection capacitor 12 is generated due to the existence of the detection target can be grasped in advance, the determination threshold ΔVth for whether or not the detection target is present is appropriately set regardless of the absolute value of the detection capacitance Cx including the parasitic capacitance of the detection capacitor 12.

Here, the intermediate potential Vout is a potential of capacitive voltage division of the power supply by the combined capacitance Cs and the capacitance of the detection capacitor 12, so that even when the reference combined capacitance Csb is changed instead of the capacitance change of the detection capacitor 12, the same voltage change amount is generated. The capacitance change unit 18*e* controls the switching control unit 18*b* to change the reference combined capacitance Csb by the predetermined capacitance change amount ΔCx_th, thereby generating the voltage change amount DV of the intermediate potential Vout due to the existence of the detection target. The setting unit 18*f* sets the determination threshold ΔVth, based on a difference between the intermediate potential Vout that is the reference combined capacitance Csb and the intermediate potential Vout that is the changed reference combined capacitance Csb, and can thus favorably set determination sensitivity for whether or not the detection target is present regardless of the absolute value of the detection capacitance Cx including the parasitic capacitance of the detection capacitor 12 or disturbance (a state of an external electrode, a wiring capacitance, and the like). Further, whether or not the detection target is present can be more accurately determined.

Further, the combined capacitance Cs is quickly converged to the reference combined capacitance Csb related to the setting of the determination threshold ΔVth by selectively switching the plurality of capacitors 22 to the on and off state by the switching control unit 18*b*. For example, the number of times by which the plurality of capacitors 22 are selectively switched to the on state and the off state is on the order of ten and several times. Therefore, a time required for setting the determination threshold ΔVth and determining whether or not the detection target is present can be further shortened.

Further, as in Reference 2, it is not necessary to connect a sensitivity compensation capacitor in parallel with the detection capacitor via a switch, and the determination threshold ΔVth can be set using the controllable combined capacitance of the existing capacitor array 11, so that a circuit configuration can be further simplified.

(2) In the present embodiment, since the detection unit 18*a* only needs to detect the differential voltage ΔV between the intermediate potential Vout and the reference potential Vref, for example, a range required for the detection can be further reduced as compared to the entire range of the intermediate potential Vout. Since an expensive and large-scale high-resolution ADC is not required, the costs can be reduced.

(3) In this embodiment, the differential amplifier circuit 16 amplifies the differential voltage ΔV between the intermediate potential Vout and the reference potential Vref, so that the differential voltage ΔV can be made more prominent, and an SN ratio can be further improved. In particular, when characteristics of the differential amplifier circuit 16 are completely differential, common-mode noise can be cut. Further, when the amplification factor of the differential amplifier circuit 16 is changed according to the absolute value of the differential voltage ΔV, even in the AD conversion circuit 17 in which the minimum unit (LSB) of the AD conversion is constant, the minimum unit can be substantially changed. Therefore, the AD conversion circuit 17 having a simple configuration can be adopted, and the costs can be reduced.

Further, as the amplification factor of the differential amplifier circuit 16 is set such that the digital value of the differential voltage ΔV AD-converted by the AD conversion circuit 17 coincides with the voltage change amount of the detection capacitance Cx, a calculation load required for setting the determination threshold ΔVth and the like can be further reduced.

(4) In the present embodiment, the differential voltage ΔV between the intermediate potential Vout and the reference potential Vref is AD-converted by the AD conversion circuit 17, so that the differential voltage ΔV can be handled as the digital value, and smoother arithmetic processing can be realized.

(5) In the present embodiment, a time required for setting the determination threshold ΔVth and for determining whether or not the detection target is present can be further reduced, so that a circuit stop time can be lengthened, and current consumption of the entire device can be reduced. Alternatively, since the time required for setting the determination threshold ΔVth and for determining whether or not the detection target is present can be further reduced, the influence on low-frequency noise superimposed on the power supply (high-side potential V1 or the like) or an increase in the fluctuation width of the power supply itself can be reduced, and whether or not the detection target is present can be determined with higher accuracy.

(6) In the present embodiment, a time required for calculating the voltage change amount DV of the intermediate potential Vout for determining whether or not the detection target is present can be further reduced, so that, for example, the number of times of calculations within a certain time can be further increased. Therefore, by performing a filtering process such as averaging the voltage change amount DV calculated within a certain time, whether or not the detection target is present can be determined with higher accuracy.

(7) In the present embodiment, for example, there is no need to store mapping data representing a determination threshold corresponding to the reference combined capacitance Csb correlated with the capacitance of the detection capacitor 12, so that the circuit configuration can be further simplified. Alternatively, like the mapping data, the determination threshold ΔVth can be set more accurately by actual measurement as compared with a determination threshold that changes stepwise. Alternatively, since the determination threshold ΔVth is actually measured, the determination threshold ΔVth can be suitably set even when, for example, the electrode shape itself of the detection capacitor 12 is changed.

(8) In the present embodiment, when setting the determination threshold ΔVth, by performing the same operation as that for determining whether or not the detection target is present, self-diagnosis such as abnormality detection can be performed prior to the determination.

(9) In the present embodiment, since the capacitances Cn (n=0 to 7) of the plurality of capacitors 22 have a power-of-two relationship, the reference combined capacitance Csb can be acquired in the shortest time by a binary search, and furthermore, the time required for setting the determination threshold ΔVth and the like can be further reduced.

(10) In the present embodiment, the self-diagnosis unit 18g that determines whether or not the device is normal, based on whether or not the determination threshold ΔVth set by the setting unit 18f falls within the predetermined normality determination numerical value ranges Z1 and Z2, is provided. Therefore, whether or not the device itself is normal can be determined by the self-diagnosis unit 18g.

The present embodiment can be modified and implemented as follows. The present embodiment and the following modification can be implemented in combination with each other within a technically consistent range.

Figure 8:
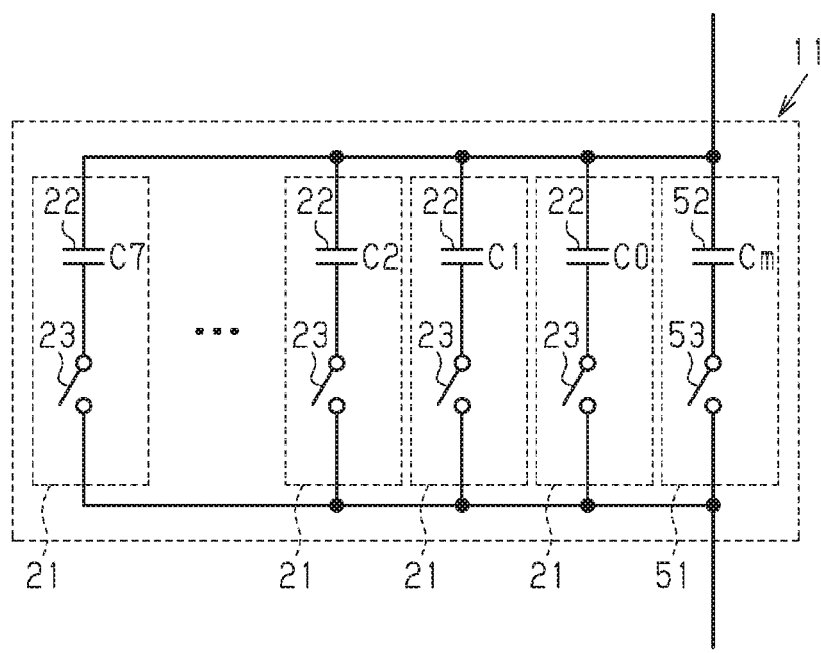
FIG. 8 is a circuit diagram showing a capacitor array in a modification of the capacitance detection device.

As shown in FIG. 8, for example, when the capacitance change amount ΔCx_th is extremely small and cannot be represented by a resolution of the capacitance Cn, a dedicated adjustment capacitance unit 51 may be further connected in parallel to the plurality of capacitance units 21. The adjustment capacitance unit 51 has an adjustment capacitor 52 and an adjustment switch 53 connected in series to each other. The adjustment capacitor 52 has a capacitance Cm that cannot be expressed by a resolution of the capacitance Cn. The capacitance Cm is set such that as the adjustment capacitor 52 is in the on state and any of the capacitors Cn (n=0-7) is switched between the on state and the off state, the combined capacitance Cs can be reduced by the capacitance change amount ΔCx_th.

Alternatively, the device is always turned on when Cm=ΔCx_th, and may be turned off when the capacitance change amount ΔCx_th is reduced. Although an offset of the capacitance Cm always occurs in the combined capacitance Cs, this is not a problem in a device that detects a change in a capacitance.

In the embodiment, when the capacitance change amount ΔCx_th cannot be represented by the bit of the control value bn, the bit closest to the capacitance change amount ΔCx_th may be adopted.

In the embodiment, the second reference combined capacitance Csb2 may be used as the reference combined capacitance Csb. That is, the control circuit 18 as the acquisition unit 18c may acquire, as the reference combined capacitance Csb, any of the combined capacitances in a vicinity where the magnitude relationship between the intermediate potential and the reference potential is inverted on assumption that the threshold can be determined within the input range of the ADC. In this case, it is preferable that the control circuit 18 acquires, as the reference combined capacitance Csb, the combined capacitance having a small deviation between the intermediate potential and the reference potential among the two adjacent combined capacitances. When it is assumed that the combined capacitance Cs and the intermediate potential Vout are in a proportional relationship between the first and second reference combined capacitances Csb1 and Csb2, the differential voltage ΔV is a value corresponding to a half or less of the capacitance C0.

In the embodiment, the reference potential Vref, which is an adjustment target value of the potential of the capacitive voltage division of the power supply, is not limited to "V1/2", and may be changed to, for example, "V1/3" in a predetermined manner.

In the embodiment, the capacitances Cn (n=0 to 7) of the plurality of capacitors 22 of the capacitor array 11 may not have a power-of-two relationship as indicated by Equation (1). For example, the capacitances Cn (n=0 to 7) may be in a relationship of a power of a natural number of 3 or more.

In the embodiment, the number of the capacitors 22 of the capacitor array 11 is predetermined as long as the capacitors 22 have different capacitances. Further, the capacitances of the plurality of capacitors 22 may be in a relationship of a power of a natural number of 2 or more, or may be in a relationship of increasing gradually with a certain deviation.

In the embodiment, for example, as in a case where the combined capacitance Cs of the capacitor array 11 is changed according to the control value bn (n=0 to 7), the AD conversion circuit 17 may output a constant digital value indicating that the absolute value of the differential voltage ΔV exceeds a predetermined value when the absolute value of the differential voltage ΔV exceeds the predetermined value, and may output a digital value indicating the differential voltage ΔV when the absolute value of the differential voltage ΔV is smaller than the predetermined value.

Alternatively, the AD conversion circuit 17 may be constituted by a plurality of units or a plurality of channels such that the minimum unit (LSB) of the AD conversion can be changed in accordance with the absolute value of the differential voltage ΔV. In this case, for example, as in a case where the combined capacitance Cs of the capacitor array 11 is changed according to the control value bn (n=0 to 7), when the absolute value of the differential voltage ΔV exceeds a predetermined value, the AD conversion circuit 17 outputs a digital value obtained by the AD conversion in a relatively large set minimum unit. On the other hand, when the absolute value of the differential voltage ΔV is lower than the predetermined value, the AD conversion circuit 17 outputs a digital value obtained by the AD conversion in a relatively small minimum unit.

In any case, when the absolute value of the differential voltage ΔV is lower than the predetermined value, that is, when the intermediate potential Vout is close to the reference potential Vref, the AD conversion circuit 17 only needs to perform the AD conversion in a minimum unit smaller than the voltage change of the intermediate potential Vout due to a change corresponding to the resolution of the combined capacitance Cs.

In the embodiment, the AD conversion circuit 17 may be omitted, and the capacitance of the detection capacitor 12 may be detected by analog processing.

In the embodiment, the differential amplifier circuit 16 may be omitted, and the differential voltage ΔV may be AD-converted by the AD conversion circuit 17 as it is.

In the embodiment, an amplifier for amplifying the intermediate potential Vout may be employed instead of the differential amplifier circuit 16. Alternatively, the differential amplifier circuit 16 may be omitted, and the intermediate potential Vout may be AD-converted by the AD conversion circuit 17 as it is. That is, the control circuit 18 serving as the detection unit 18a may detect the intermediate potential Vout.

In the embodiment, a plurality of the detection capacitors 12 related to the determination on whether or not the detection target is present may be provided. When whether or not an individual detection target is present is determined based on the plurality of detection capacitors 12, a switch may be provided which is selectively connected to the other circuit configurations (the capacitor array 11, and the like) in a time division manner. It is apparent that the determination thresholds ΔVth of the plurality of detection capacitors 12 can be set individually. The determination on whether or not the detection target is present by the plurality of detection capacitors 12 can be realized by shortening a time required for determining whether or not the detection target is present by each detection capacitor 12.

In the embodiment, a comparator may be provided between the connection point N1 and the control circuit 18 for inputting the intermediate potential Vout and the reference potential Vref to determine the magnitude relationship therebetween. Then, in the above-described binary search, the magnitude relationship between the intermediate potential Vout and the reference potential Vref, that is, the magnitude relationship between the combined capacitance Cs and the detection capacitance Cx may be determined by the comparator instead of the differential amplifier circuit 16 or the like. Even in this case, the control circuit 18 can determine the set value "abcd_efgh" of the capacitor array 11 based on the determination result by the comparator.

The technical idea that can be grasped from the embodiments and the modifications will be described.

A capacitance detection device according to an aspect of this disclosure includes: a capacitor array which has a plurality of parallel-connected capacitors having different capacitances, and whose combined capacitance is changed by selectively switching the plurality of capacitors between on and off states; a detection capacitor that is connected in series to the capacitor array; a switching control unit that selectively switches the plurality of capacitors between the on and off states; a detection unit that detects an intermediate potential that is a potential of a capacitive voltage division of a power supply by the combined capacitance and a capacitance of the detection capacitor; an acquisition unit that acquires, as a reference combined capacitance, any of the combined capacitances in a vicinity where a magnitude relationship between the intermediate potential and a predetermined reference potential is inverted; a determination unit that determines whether or not a detection target is present, based on a magnitude relationship between a determination threshold and a change amount of the intermediate potential when the combined capacitance is the reference combined capacitance; a capacitance change unit that controls the switching control unit to change the reference combined capacitance by a predetermined capacitance change amount such that the change amount of the intermediate potential based on a capacitance change of the detection capacitor caused by presence of the detection target is generated; and a setting unit that sets the determination threshold based on a difference between the intermediate potential in the reference combined capacitance and the intermediate potential in the changed reference combined capacitance.

According to this configuration, the acquisition unit acquires the reference combined capacitance near the capacitance of the capacitor array when the intermediate potential coincides with the reference potential. Then, the determination unit determines whether or not the detection target is present, based on a magnitude relationship between the change amount of the intermediate potential and the determination threshold when the combined capacitance is the reference combined capacitance.

The capacitance change of the detection capacitor caused by existence of the detection target is independent of a parasitic capacitance included in the capacitance of the detection capacitor. On the other hand, the change amount of the intermediate potential due to a change in the capacitance of the detection capacitor when the combined capacitance is the reference combined capacitance, that is, the determination threshold for whether or not the detection target is present, changes according to an absolute value of the capacitance of the detection capacitor including a parasitic capacitance. Therefore, when the combined capacitance is the reference combined capacitance, if the change amount of the intermediate potential when a capacitance change of the detection capacitor occurs due to the presence of the detection target can be grasped in advance, the determination threshold for whether or not the detection target is present is appropriately set regardless of the absolute value of the capacitance of the detection capacitor including the parasitic capacitance.

Here, the intermediate potential is a potential of capacitive voltage division of the power supply by the combined capacitance and the capacitance of the detection capacitor, so that even when the reference combined capacitance is changed instead of the capacitance change of the detection capacitor, the same change amount occurs. The capacitance change unit controls the switching control unit to change the reference combined capacitance by a predetermined capacitance change amount, thereby generating a change amount of the intermediate potential due to the presence of the detection target. The setting unit sets the determination threshold based on a difference between the intermediate potential when the reference combined capacitance is the intermediate potential and the intermediate potential when the changed reference combined capacitance is the intermediate potential, and thus can favorably set the determination threshold for whether or not the detection target occurs regardless of the absolute value of the capacitance of the detection capacitor including the parasitic capacitance.

Further, the combined capacitance can be promptly converged to the reference combined capacitance related to the setting of the determination threshold by selectively switching the plurality of capacitors to the on and off states by the switching control unit. Therefore, a time required for setting the determination threshold can be further reduced.

In the capacitance detection device, it is preferable that the detection unit detects a differential voltage between the intermediate potential and the reference potential.

According to this configuration, since the detection unit only needs to detect the differential voltage between the intermediate potential and the reference potential, a range required for the detection can be further reduced as compared to, for example, the entire range of the intermediate potential.

It is preferable that the capacitance detection device further includes an amplification unit that amplifies the differential voltage between the intermediate potential and the reference potential.

According to this configuration, the amplification unit amplifies the differential voltage between the intermediate potential and the reference potential, so that the differential voltage can be made more prominent.

It is preferable that the capacitance detection device further includes an AD conversion unit that AD-converts the differential voltage between the intermediate potential and the reference potential.

According to this configuration, the differential voltage between the intermediate potential and the reference potential can be handled as a digital value, and smoother arithmetic processing can be realized.

It is preferable that the capacitance detection device includes a self-diagnosis unit that determines whether or not the device is normal, based on whether or not the determination threshold set by the setting unit falls within a predetermined normality determination numerical value range.

According to this configuration, the self-diagnosis unit can determine whether or not the device itself is normal.

The present disclosure can favorably set a determination threshold for whether or not a detection target is present while shortening a time required for determining whether or not the detection target is present.

In the capacitance detection device, it is preferable that the capacitances of the plurality of capacitors have a power-of-two relationship.

According to this configuration, the first combined capacitance and the second combined capacitance can be acquired in the shortest time by the binary search.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A capacitance detection device comprising:
    a capacitor array which has a plurality of parallel-connected capacitors having different capacitances, and whose combined capacitance is changed by selectively switching the plurality of capacitors between on and off states;
    a detection capacitor that is connected in series to the capacitor array;
    a switching control unit that selectively switches the plurality of capacitors between the on and off states; and
    a control circuit configured to
        control the switching control unit to generate an intermediate potential that is a potential of a capacitive voltage division of a power supply by the combined capacitance and a capacitance of the detection capacitor;
        detect the intermediate potential;
        acquire, as a reference combined capacitance, any of the combined capacitances in a vicinity where a magnitude relationship between the intermediate potential and a predetermined reference potential is inverted;
        determine whether or not a detection target is present, based on a magnitude relationship between a determination threshold and a change amount of the intermediate potential when the combined capacitance is the reference combined capacitance;
        when the detection target is present, control the switching control unit to change the reference combined capacitance by a predetermined capacitance change amount such that the change amount of the intermediate potential based on a capacitance change of the detection capacitor caused by presence of the detection target is generated;
        detect a differential voltage between the intermediate potential in the reference combined capacitance and the intermediate potential in the changed reference combined capacitance; and
        set the determination threshold based on the detected differential voltage.

2. The capacitance detection device according to claim 1, further comprising:
    an amplification unit that amplifies the differential voltage between the intermediate potential and the reference potential.

3. The capacitance detection device according to claim 1, further comprising:
    an AD conversion unit that AD-converts the differential voltage between the intermediate potential and the reference potential.

4. The capacitance detection device according to claim 1, further comprising:
    a self-diagnosis unit that determines whether or not the device is normal, based on whether or not the determination threshold set by the setting unit falls within a predetermined normality determination numerical value range.

5. The capacitance detection device according to claim 1, further comprising:
    a first switch which initializes the capacitor array, the first switch being connected between both terminals of the capacitor array;
    a second switch electrically connected between the capacitor array and the detection capacitor, and connects and disconnects between the capacitor array and the detection capacitor; and a third switch which initializes the detection capacitor, the third switch being connected between both terminals of the detection capacitor, wherein the switching control unit generates the intermediate potential by turning on both the first switch and the third switch, and turning off the second switch so as to initialize each of the capacitor array and the detection capacitor, and turning off both the first switch and the third switch, and turning on the second switch so as to connect the capacitor array and the detection capacitor in series to each other and generate the intermediate potential.

\* \* \* \* \*